(12) United States Patent
Magn et al.

(10) Patent No.: US 7,335,921 B2
(45) Date of Patent: Feb. 26, 2008

(54) LIGHTING DEVICES USING FEEDBACK ENHANCED LIGHT EMITTING DIODE

(75) Inventors: John N. Magn, Middletown, NJ (US); Gene C. Koch, Bayville, NJ (US)

(73) Assignee: ZeoLux Corporation, Sammamish, WA (US)

( * ) Notice: Subject to any disclaimer, the term of this patent is extended or adjusted under 35 U.S.C. 154(b) by 0 days.

(21) Appl. No.: 10/431,885

(22) Filed: May 8, 2003

(65) Prior Publication Data
US 2004/0066824 A1 Apr. 8, 2004

Related U.S. Application Data
(60) Provisional application No. 60/379,141, filed on May 8, 2002.

(51) Int. Cl.
*H01L 27/15* (2006.01)
*H01J 1/62* (2006.01)
*G01G 3/10* (2006.01)

(52) U.S. Cl. .................. 257/80; 257/84; 313/504; 313/506; 315/169.3

(58) Field of Classification Search ............... 257/80, 257/84, 79, 103; 315/169.3, 169.4
See application file for complete search history.

(56) References Cited

U.S. PATENT DOCUMENTS

| | | | |
|---|---|---|---|
| 5,142,192 A | 8/1992 | Takahashi et al. .......... 313/506 |
| 5,365,541 A | 11/1994 | Bullock | |
| 5,406,573 A | 4/1995 | Ozbay et al. | |
| 5,479,275 A * | 12/1995 | Abileah .................. 349/5 |
| 5,537,000 A | 7/1996 | Alivisatos et al. | |
| 5,559,400 A | 9/1996 | Nakayama et al. ......... 313/506 |
| 5,847,506 A | 12/1998 | Nakayama et al. ......... 313/504 |
| 6,072,275 A | 6/2000 | Kobashi .................. 313/506 |
| 6,075,317 A | 6/2000 | Keyser et al. ............. 313/505 |
| 6,091,195 A | 7/2000 | Forrest et al. ............ 313/504 |
| 6,091,197 A | 7/2000 | Sun et al. | |
| 6,097,147 A | 8/2000 | Baldo et al. ............. 313/506 |
| 6,142,643 A | 11/2000 | Araki et al. ............ 362/84 |
| 6,160,828 A | 12/2000 | Kozlov et al. | |
| 6,259,423 B1 | 7/2001 | Tokito et al. | |
| 6,280,559 B1 | 8/2001 | Terada et al. | |
| 6,304,366 B1 | 10/2001 | Scalora et al. | |
| 6,330,111 B1 * | 12/2001 | Myers ..................... 359/599 |
| 6,330,265 B1 | 12/2001 | Kinoshita | |
| 6,352,359 B1 * | 3/2002 | Shie et al. ............. 362/522 |
| 6,396,859 B1 | 5/2002 | Kopp et al. | |
| 6,404,789 B1 | 6/2002 | Kopp et al. | |
| 6,411,635 B1 | 6/2002 | Kopp et al. | |
| 6,433,355 B1 | 8/2002 | Riess et al. | |
| 6,541,911 B1 | 4/2003 | Tanabe et al. | |
| 6,661,480 B2 * | 12/2003 | Fujishiro et al. ........... 349/65 |
| 6,830,831 B2 | 12/2004 | O'Neill et al. | |
| 6,867,243 B2 | 3/2005 | O'Neill et al. | |
| 2001/0033136 A1 | 10/2001 | Kawase | |
| 2001/0036212 A1 | 11/2001 | Kopp et al. | |
| 2001/0038102 A1 | 11/2001 | Kawase | |
| 2001/0043627 A1 | 11/2001 | Koyama et al. ........... 372/39 |

(Continued)

OTHER PUBLICATIONS

Kopp et al., "Low-threshold lasing at the edge of a photonic stop band in cholesteric liquid crystals", Optics Letters, Nov. 1, 1998, vol. 23, No. 21.

*Primary Examiner*—Tuyet Thi Vo
(74) *Attorney, Agent, or Firm*—Ronald D. Trice (57) ABSTRACT

Lighting devices using feedback-enhanced luminescent devices are disclosed. A light emitting diode disposed between feedback elements (FE-LED) may be used as a light emitting element in the lighting devices. The light emitting element may be coupled to a light distribution element. In one aspect, the light emitting diode may be an organic light emitting diode (FE-OLED).

66 Claims, 6 Drawing Sheets

U.S. PATENT DOCUMENTS

| | | |
|---|---|---|
| 2002/0003827 A1 | 1/2002 | Genack et al. |
| 2002/0009274 A1 | 1/2002 | Gharavi |
| 2002/0018620 A1 | 2/2002 | Koyama et al. |
| 2002/0118710 A1 | 8/2002 | Kopp et al. |
| 2002/0131707 A1 | 9/2002 | Kopp et al. |
| 2003/0018097 A1 | 1/2003 | O'Neill et al. |
| 2003/0021913 A1 | 1/2003 | O'Neill et al. |
| 2003/0027017 A1 | 2/2003 | O'Neill et al. |
| 2003/0072966 A1 * | 4/2003 | Hosokawa et al. ......... 428/690 |
| 2004/0007969 A1 * | 1/2004 | Lu et al. .................... 313/501 |
| 2004/0155238 A1 * | 8/2004 | Thompson et al. ........... 257/40 |
| 2005/0006999 A1 * | 1/2005 | Minoura et al. ............ 313/110 |

* cited by examiner

LIGHTING DEVICES USING FEEDBACK ENHANCED LIGHT EMITTING DIODE

CROSS-REFERENCE TO RELATED APPLICATIONS

This application claims the benefit of U.S. Provisional Application No. 60/379,141 filed May 8, 2002, incorporated herein in its entirety by reference thereto. This application is related to U.S. patent application Ser. No. 10/434,941, filed on May 8, 2003, and entitled "FEEDBACK ENHANCED LIGHT EMITTING DEVICE," and U.S. patent application Ser. No. 10/434,326, filed on May 8, 2003, and entitled "DISPLAY DEVICES USING FEEDBACK ENHANCED LIGHTING DIODE," which applications are incorporated herein in their entirety by reference.

TECHNICAL FIELD

The present application relates to lighting devices using feedback enhanced light emitting diodes.

BACKGROUND

Conventional lighting devices providing indoor and outdoor lighting typically use incandescent electric light bulbs, florescent lamps, or halogen lamps. The existing lighting devices, however, have short lifespan, high costs, and/or hazards associated with them. Recently, light emitting diode (LED) lamps have been used to provide general lighting to overcome some of the shortcomings of the existing lighting devices. Even in LED operated lamps, however, most of the light is absorbed or lost as heat, wasting a high percentage of the energy that can be provided as light. According, it is desirable to have a more efficient lighting device that can eliminate or reduce loss of energy and more efficiently provide lighting.

SUMMARY

Lighting devices using feedback-enhanced luminescent devices are provided. A lighting device in one aspect comprises a light source comprising at least one layer of luminescent material disposed between two feedback layers. At least one of the two feedback layers has a periodically varying refractive index profile.

The light source may be mounted in a housing having an at least one opening. A light distribution element may be mounted in the housing and disposed between the light source and the opening for distributing light emitted from the light source towards the opening. In another aspect, a second light distribution element such as a forward diffuser may be mounted in the housing between the opening and the light distribution element. Yet in another aspect, the second light distribution element may be mounted so as to cover the opening of the housing.

In one aspect, one or both of the feedback layers comprise at least a layer of holographic recording material. The layer of holographic recording material may include a plane wave interference pattern patterned in the material. In another aspect, one or both of the two feedback layers may include a holographic recording material having a plurality of plane wave interference patterns corresponding to different wavelength of light.

In another aspect, a lighting device may comprise at least one layer of light emissive material disposed between two feedback layers. The light emissive material may be an organic material. At least one of the two feedback layers has a periodically varying refractive index profile. A light distribution element such as a light diverging screen or a diffuser may be attached to the light source for diffusing the light emitted from the emissive layer. In one aspect, one or both of the feedback layers comprise at least a layer of holographic recording material. The layer of holographic recording material may include a plane wave interference pattern patterned on the material. In another aspect, one or both of the two feedback layers may include a holographic recording material having a plurality of plane wave interference patterns corresponding to different wavelengths of light.

Further features as well as the structure and operation of various embodiments are described in detail below with reference to the accompanying drawings. In the drawings, like reference numbers indicate identical or functionally similar elements.

DETAILED DESCRIPTION

Lighting devices such as lamps using feedback-enhanced light emitting diodes are disclosed. In the present application, the terms luminescent material, emissive material, and emitter material are used interchangeably and refer to those material that have luminescent properties. The structure and operation of a feedback enhanced light emitting diode are fully disclosed in co-pending U.S. patent application Ser. No. 10/434,941 entitled "FEEDBACK ENHANCED LIGHT EMITTING DEVICE." For example, FIGS. 1 and 2 illustrate feedback enhanced light emitting diodes that may be used in the lighting devices of the present disclosure.

Figure 1:
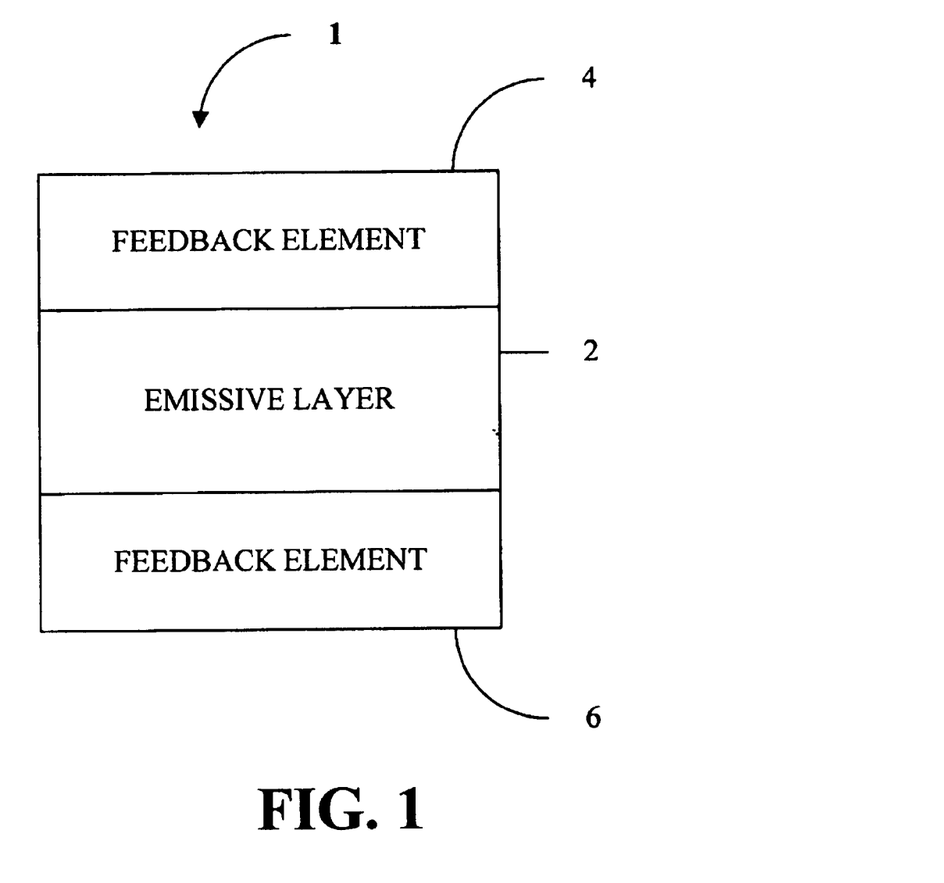
FIG. 1 illustrates an emissive device that may be used in the lighting devices of the present disclosure in one embodiment.
Figure 2:
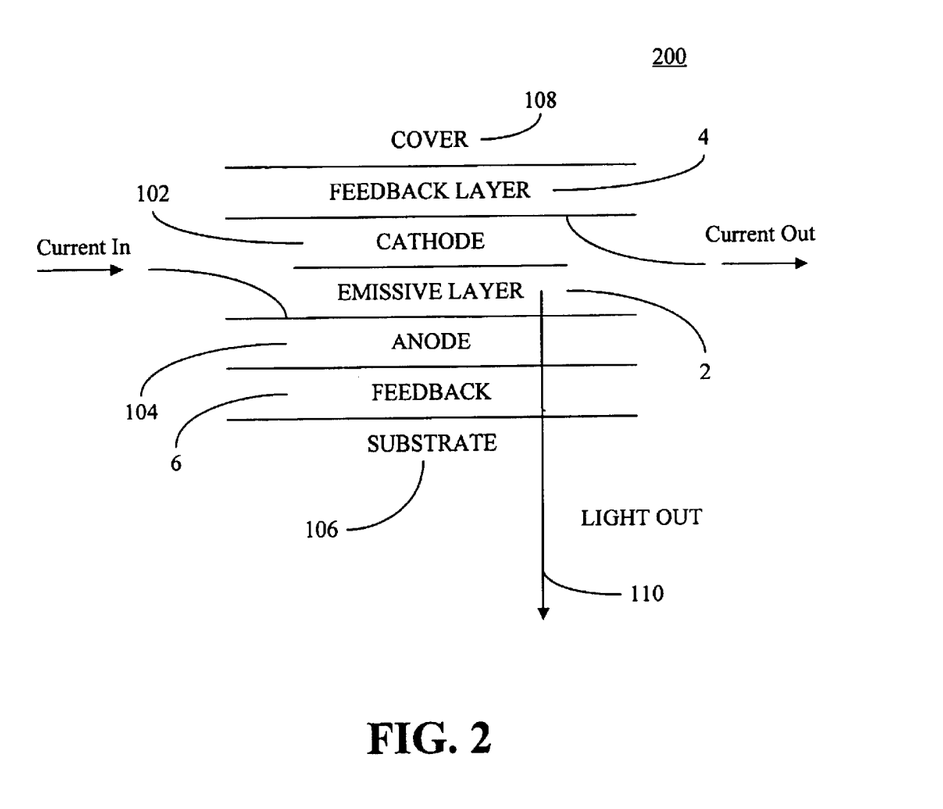
FIG. 2 illustrates a feedback-enhanced light emitting diode in one embodiment that is used in the lighting devices of the present disclosure.

FIG. 1 illustrates an emissive device that may be used in the lighting devices of the present disclosure in one embodiment. The device 1 includes an emissive layer 2 and a feedback element 4. The feedback element 4 may be a layer with a periodic index of refraction variation that allows some light to be transmitted through the feedback element 4. In another aspect, the feedback element 4 may be a layer with periodic and continuous index of refraction variation. A feedback element layer with a periodic and continuous index of refraction variation is described in detail in co-pending U.S. patent application Ser. No 10/434,941, entitled "FEEDBACK ENHANCED LIGHT EMITTING DEVICE."

A second feedback element 6 may also be included such that the emissive layer is between the two feedback elements 4, 6. The second feedback element 6 may allow some light to be transmitted through the second feedback element 6 or substantially reflect the light incident upon it. In one embodiment, a structure with a periodic index of refraction variation, a plane mirror, a distributed Bragg reflector (DBR), or another reflector may be used as the second feedback element 6. The emissive layer 2 may be comprised of organic material. The emissive layer 2 may also be an organic light emitting diode.

The feedback-enhanced light emitting diode in one aspect may also include other elements such a transparent buffer layer lying between the feedback layers and the emissive layer, a diffuser, an anode, a cathode or other elements. FIG. 2 illustrates an emissive device 200 having additional elements. For example, a pair of electrodes such as a cathode 102 and an anode 104 may be placed between an emissive layer 2 and the top 4 and bottom 6 feedback layers, respectively.

The cathode 102 may include a transparent conductive structure with a low work function surface adjacent to the emissive layer 2 such that it is able to inject electrons into the emissive layer 2. In one aspect, in order that the cathode 102 provides the desired transparency, a two-layer cathode may be provided. The two-layer cathode may include a very thin, for example, 5 nanometer (nm) metal cathode such that the metal is essentially transparent. The metal may then be backed, for example, on the feedback layer side, with a transparent conductor like indium-tin oxide (ITO) to yield high enough conductivity to have a low impedance device. The anode 104 may include a transparent conductive material chosen to have a high work function such that it is able to inject holes into the emissive layer 2.

The emissive layer 2 may include an organic electroluminescent material whose spectral emission band overlaps the reflection bands of the top 4 and bottom feedback layers 6. In one aspect, the emissive layer 2 may also be a fluorescent or phosphorescent emissive material, an emissive inorganic semiconductor material such as GaAs, AlGaAs, or InGaN.

The top 4 and/or the bottom feedback layers 6 may include light non-absorbing material with a periodically varying index of refraction. The top 4 and the bottom feedback layers 6 may act as a photonic crystal that reflects light of a given wavelength band propagating along the axis labeled "light out" 110.

The light entering the feedback layer material along the layer normal axis suffers a small reflection each time it passes through one cycle of the refractive index oscillation. When the feedback element is thick enough, the feedback element may act as a nearly perfect reflector at the resonant wavelength, $2d$, where d is the pitch of the refractive index spatial oscillation.

The feedback layers in one aspect are fabricated from plane wave holograms with peak reflectivity at the desired emission wavelength. In one aspect, the device 200 shown in FIG. 2 may be inverted. That is, the position of the cathode 102 and the anode 104 may be interchanged.

The device also may include a substrate 106 placed adjacent to the bottom feedback layer 6. The substrate 106 is used as a layer on which the device may be built. In one aspect the substrate 106 may comprise a transparent material. In one aspect, a material may be applied over the device to function as a cover 108. The cover 108, for example, functions to hermetically seal out ambient water and oxygen, or otherwise to protect the device from chemical or other degradation.

Other components of the device may include a hole transport layer between the anode 104 and the emissive layer 2. The hole transport layer may be used to allow more electron/hole recombination to occur at the emissive layer 2. For example, in emissive layers having imbalance between electron and hole mobilities, usually with low hole mobilities, the electron/hole recombination tends to occur at the anode. Similarly, a device with a direct anode/emitter interface tends to be inefficient because many traps, that is, sites at which non-radiative de-excitation of the emitter occurs, exist at the emitter/anode interface. Using hole transport layers, for example, with high hole mobilities minimizes the problem of the electron/hole recombination occurring at the anode. The hole transport layer may also be chosen to have a hole conduction band intermediate between those of the anode 104 and the emissive layer 2, thus providing more efficient hole injection from the anode into the emitter.

A hole injection layer may also be provided between the anode 104 and the hole transport layer. For example, if anode materials like indium-tin oxide (ITO) having less than well defined band structures that may lead to inefficient hole injection into the device are used, hole injection layers like copper phthalocyanine may be provided to better define band structure with energy level intermediate between ITO and hole transport materials. Providing the additional hole injection layers thus may assist hole injection and produce a more efficient device.

In another embodiment, additional hole transport layers may be inserted between the hole injection layer and the emitter to further smooth out band energy differences. If the hole transport layer adjacent to the emitter has its electron conduction band at an energy level nearly the same as the emitter, electrons can "overshoot" the emitter with recombination occurring in the transport layer rather than the emitter. This overshoot may be eliminated by interposing an electron blocking layer that has a high energy electron conduction band, but good hole conduction, between the emitter and the transport layer.

In another embodiment, an electron transport layer may be provided between the cathode 102 and the emissive layer 2. The electron transport layer performs the similar function for electrons that the hole transport layer performs for holes. As with hole transport layers, additional electron transport layers may be added to assist band energy matching.

In another embodiment, an electron injection layer may be provided between the cathode 102 and the electron transport layer. Ideally, it is desirable to have as low a work function material for the cathode as possible so that energy is not expended injecting electrons into the device. Very low work function metals such as calcium may be used. Calcium, however, may be very chemically reactive and very sensitive to moisture and oxygen. Aluminum also may be used. Although aluminum has higher work function, it has been found that overcoating the aluminum with a very thin film of materials like lithium or magnesium fluoride provides a "band bending" effect that helps relieve the band energy mismatch.

In another embodiment, a hole blocking layer may be provided between the emitter and hole transport layer to eliminate hole "overshoot" from the emitter. The above described carrier transport, injection, and blocking layers are also typically used in the conventional OLED devices. Accordingly, further details of these elements will not be described herein.

In one embodiment, the device 200 may also include a buffer layer, for example, a clear dielectric interposed between an electrode and a feedback layer. When the buffer layer is placed between the cathode 102 and the top feedback layer 4, it may act as a hermetic barrier between the cathode and the outside environment especially during subsequent processing. The buffer layer also provides the right size gap between the feedback layers 4 and 6 such that destructive interference of light in the gap does not occur. To achieve this function, the buffer layer may be inserted between the feedback layer and the electrode to adjust the optical thickness of the device. The buffer layer may also be used to maintain the proper phase relationship between the refractive index profiles in the two feedback layers. In addition the buffer layer may be used to adjust the thickness of the gap between the feedback layers thereby tuning the wavelength of the modes of the light that is resonating in the gap.

The devices shown in FIGS. 1 and 2 substantially reduce or eliminate the total internal reflections that would otherwise occur at the refractive index mismatch at boundaries. This approximately doubles the amount of light extracted from the device through the substantial elimination of light absorption loss inside of the device.

In one aspect, referring back to FIG. 1, the feedback elements 4, 6 located on either side of the emissive layer 2 form a resonant cavity. The feedback elements 4, 6 reflect light back into the material of the emissive layer 2 and allow stimulated emission to occur when sufficient light is reflected into the emissive layer 2. For example, the number of interactions between photons and excitons regulate the rate of stimulated emission. Thus, by localizing light in the resonant cavity and thus causing a high density of photons at the emissive layer 2, a very rapid stimulated emission conversion may be produced.

Typically, without the induced stimulated emission, spontaneous emission, which is a relatively slow and purely statistical process, dominates the light generation process in an emissive material. The rapid conversion to stimulated emission leaves the spontaneous emission process with little or no excited state energy to convert to light. An even slower process, non-radiative de-excitation, converts excited state energy to heat. Thus, stimulated emission preempts conversion of excited state energy to heat since the mechanism of heat formation is orders of magnitude slower than that of stimulated emission. Consequently, the excited state energy of the device 1 is converted predominantly into light, not heat. The consequent reduction in heat generation also results in reduced temperature in the device, which allows for a longer life and more efficiency in the device.

Figure 3:
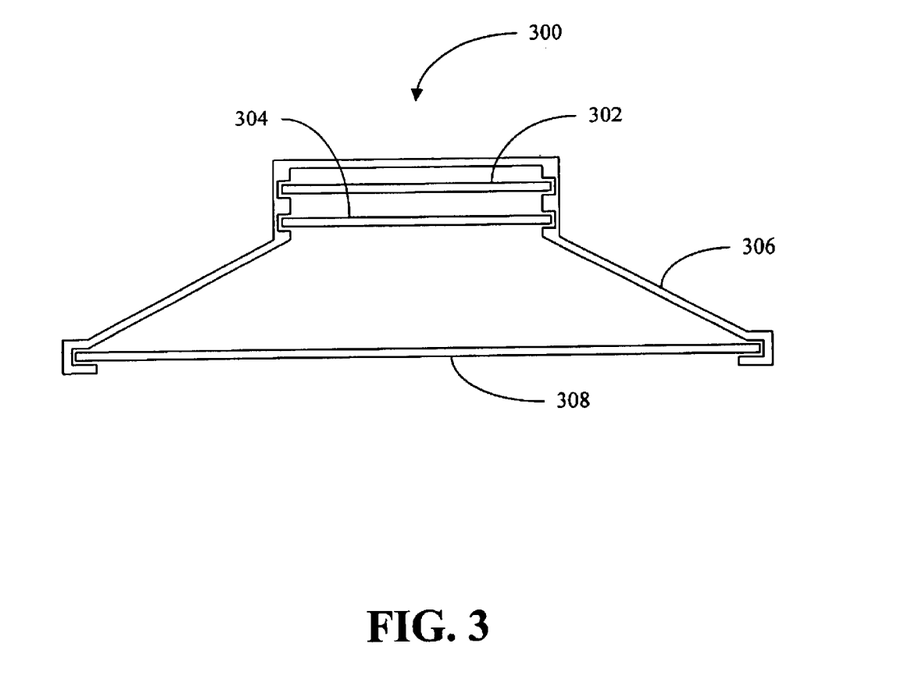
FIG. 3 illustrates a light according to one embodiment.

FIG. 3 illustrates a lamp 300 according to one embodiment of the present disclosure. The lamp 300 may be used to replace standard fluorescent tube lamps. The power conversion efficiency of the lamp 300 results in reduced electrical usage and/or greater illumination. The lamp 300 includes a feedback-enhanced light emitting diode (FE-LED) or feedback-enhanced organic light emitting diode (FE-OLED) light source 302, a light distribution element 304, a housing 306 and a second light distribution element 308 such as a forward diffuser. The FE-LED or FE-OLED light source 302 may be configured to use existing fluorescent fixtures, for example, mounted on fixtures used for fluorescent lighting. The light distribution element 304 may have a light distribution screen formed separately from the light source 302 or may be integrated into the light source 302 in order to reduce the number of components that form the lamp 300.

Figure 5:
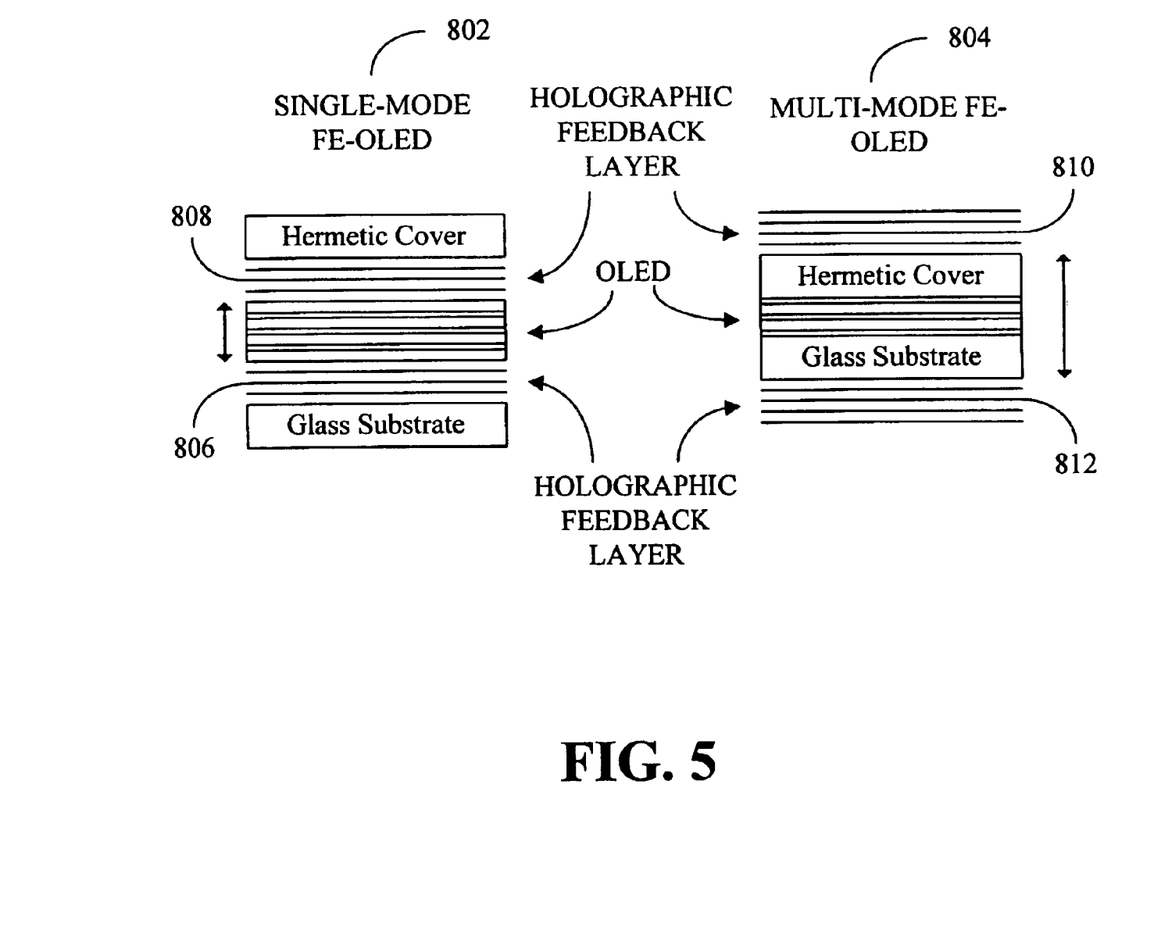
FIG. 5 illustrates a contrast between the structures of a single mode FE-OLED and a multi-mode FE-OLED.
Figure 6:
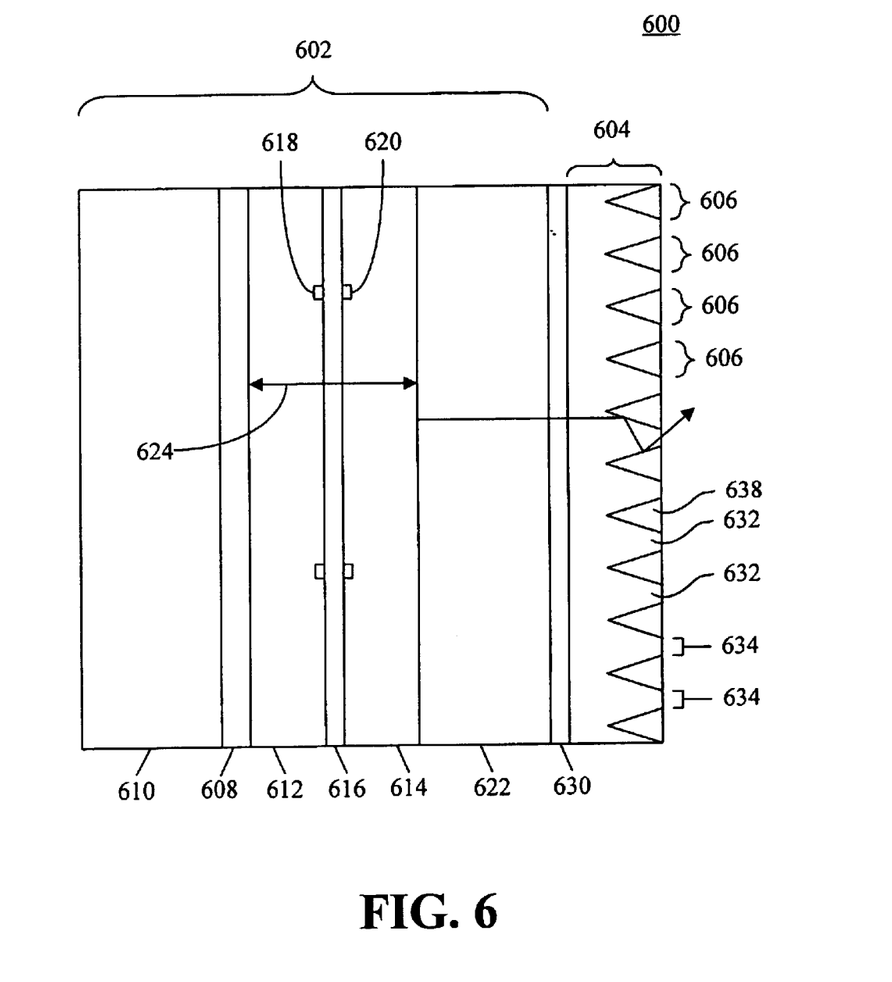
FIG. 6 illustrates a light distributor in one embodiment.

A structure and operation of embodiments of light distribution screen are described in co-pending U.S. patent application Ser. No. 10/319,631 entitled "ILLUMINANT AND METHOD," filed on Dec. 16, 2002, the entire disclosure of which is incorporated herein by reference. For example, FIG. 5 illustrates an example of a light source/distribution element combination according to an embodiment of the present disclosure. The combination illuminant 500 includes the feedback enhanced LED or OLED light source 502, a light diverging part 504, and a decorative or functional surface part located in a non-light emitting area 506. An organic light emitting diode light source may include potting material 508, a back glass 510, a back feedback layer 512, a front feedback layer 514, an organic light emitting diode (OLED) 516, an anode bus 518, a cathode bus 520 and a front glass 522. The front feedback layer 514 and the back feedback layer 512 may form a resonant cavity 524 that stimulates enhanced light emission in the organic light emitting diode 516 and may render the light rays substantially collimated. The light diverging part 504 may be adhesively bonded to the light generation part 502 with an adhesive 530. The light from the light source 502 is incident upon the light diverging part 504. The light diverging part 504 includes a tapered light guide 532 that directs light received from the light generation part 502 to a small aperture 534. The light is then emitted over a range of angles such that the light, if collimated or substantially collimated, is diverged over a range of angles thereby providing a light source which may be viewed over the range of angles and which illuminates over the range of angles. The configuration of the tapered light guide 532 is further discussed in U.S. Pat. Nos. 5,563,738 and 5,481,385, both of which are incorporated herein by reference. Area 506 may be either filled with a clear material 538 with refractive index lower than that of light guide 532 or it may be composed of a colored or reflective material or a combination of the above.

In another embodiment, two light distribution elements may be used in the lamp 300 for better light diffusion. The housing 306 may be of conventional design for lamp housings or any other suitable design. The forward diffuser 308 also may be of conventional design or any other suitable design. A lamp of the above design has approximately double the luminous efficacy of standard fluorescent lamps and approximately ten times that of incandescent lamps.

Figure 4:
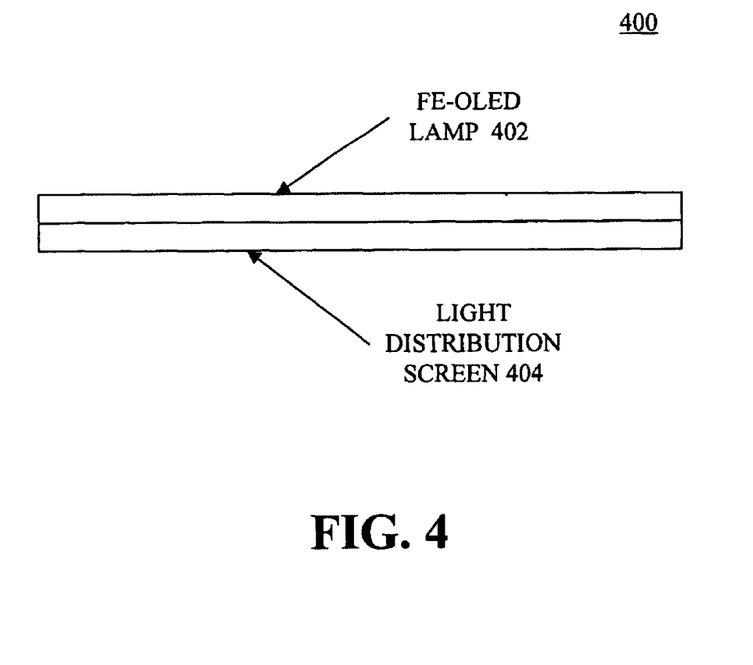
FIG. 4 illustrates an architectural lamp according to another embodiment.

FIG. 4 illustrates architectural lamp according to another embodiment of the present disclosure. The architectural lamp 400 includes a screen or diffuser 404 bonded directly to the front of the FE-LED or FE-OLED 402. The lamp 400 may be placed on a wall, ceiling, floor, or other surface to provide aesthetically pleasing lighting.

A lamp with broadband spectral distribution may be produced when, respectively two, three, four, or more feedback enhanced OLED or LED devices emitting different wavelength bands are fabricated on the same substrate in a pattern of small geometric domains such that an observer's eyes fuse them together to produce white or other desired color of light. For instance, in a three-colored example, stripes of FE-OLED emitter may be patterned in a repeating red/blue/green configuration much like the vertical color stripes in a VGA display. The lamp output appears as white light with the integrated spectral output looking like the composite line in each drawing when the stripes are sufficiently narrow.

In one embodiment, both of the feedback layers are patterned, for example, in the red/blue/green configuration as described above for the emissive layer. In this embodiment, the emissive layer may also be patterned with emitters of different wavelength bands to correspond to the feedback layer patterns. For instance, in an embodiment with relatively narrow band emitters, each time the pitch of the feedback layers is changed, the emitter is changed so that the emission and reflection bands overlap.

In a second embodiment a broadband emitter may be used such that its emission band overlaps the reflection bands of the feedback layers in two or more patterned regions. For instance, one emitter could provide both red and green light for patterned areas with feedback layer pitch set for red and green respectively. In this embodiment, for example, when a sufficiently broadband emitter is used, the emissive layer may not need to be patterned for the desired effect.

Emissive devices according to the present disclosure may be either single-mode or multi-mode devices. Single-mode devices may be produced by fabricating devices with resonant cavities (distances between feedback layers) with widths of approximately the wavelength of light emitted by the emitter while multi-mode devices have resonant cavities with widths at least several times larger than the wavelength of light emitted by the emitter. For example, FIG. 5 contrasts the structure of a single-mode FE-OLED 802 and a multi-mode FE-OLED 804. The single mode FE-OLED 802 has the holographic feedback layers 806, 808 inside a glass package with a resonant cavity width of about 400 nm, a mode spacing of approximately 0.5 μm and a spectral linewidth of around 1.5 nm.

The multi-mode FE-OLED 804 has the holographic feedback layers 810, 812 outside the glass package. For example, a mode spacing of approximately 0.2 nm occurs with the feedback layers separated by 1 mm and using 500 nm wavelength light. Spectral line width is determined by the reflective bandwidth of the feedback layers 810, 812 and is around 100 nm. In the multi-mode device 804, the holograms are easier to manufacture because they may be applied after the OLED is assembled.

In another embodiment, the multi-mode device may have the feedback layers inside the glass package or one feedback layer inside the glass package and one feedback layer outside the glass package. Transparent space including relatively thick transparent spacers may be used to fill space in between the emissive device and the feedback layers thereby establishing the desired resonant cavity thickness. An advantage of this approach is that cavity thickness may be established independently of mechanical considerations in device packaging and may be used to provide a multi-mode device that can be pixelated without parallax issues.

To a first order of approximation, the ideal design for a single-mode device with feedback layers has a resonant cavity thickness of one-half the wavelength of the desired output light and with the same phase of the periodic index variation at both feedback layer inside surfaces. Other thickness of the same order of magnitude and other phase relationships may be used.

Another embodiment of the invention may use a defect-mode FE-OLED as is disclosed in co-pending U.S. patent application Ser. No. 10/434,941 entitled "FEEDBACK ENHANCED LIGHT EMITTING DEVICE."

Another embodiment of the invention may use a band-edge lasing FE-OLED as is disclosed in co-pending U.S. patent application Ser. No. 10/434,941 entitled "FEEDBACK ENHANCED LIGHT EMITTING DEVICE."

The embodiments described above are illustrative examples and it should not be construed that the present invention is limited to these particular embodiments. Various changes and modifications may be effected by one skilled in the art without departing from the spirit or scope of the invention as defined in the appended claims.

We claim:

1. A lighting device comprising:
    a light source comprising at least:
        a first feedback layer adapted to receive and reflect light;
        a first electrode formed on the first feedback layer;
        one or more semiconducting layers formed over the first electrode, at least one of the one or more semi-conducting layers comprising luminescent material;
        a second electrode disposed over the one or more semiconducting layers; and
        a second feedback layer adapted to receive and reflect light disposed over the second electrode; and;
    a light distribution element disposed adjacent to one or both of the first feedback layer and the second feedback layer and adapted to distribute light emitted therefrom,
    wherein the first feedback layer or the second feedback layer or both the first feedback layer and the second feedback layer comprise at least a layer with a photonic crystal structure.

2. The device of claim 1, wherein the light distribution element is attached to the light source.

3. The device of claim 1, wherein the light distribution element is located immediately adjacent to the light source.

4. The device of claim 1, wherein the light distribution element comprises a diffuser for diffusing the light emitted from the light source.

5. The device of claim 1, wherein the light source and the light distribution element are shaped substantially flat and elongated.

6. The device of claim 1, wherein the light source and the light distribution element are bonded directly to one another.

7. The device of claim 1, wherein the device is adapted to be attached to a wall or ceiling or both.

8. The device of claim 1, wherein the device comprises a plurality of light distribution elements.

9. The device of claim 1, wherein the photonic crystal structure includes one-dimensional, two-dimensional, or three-dimensional photonic crystal structures or combinations thereof.

10. The device of claim 1, wherein the light distribution element comprises a light diverging screen.

11. The device of claim 5, wherein the light diverging screen comprises a plurality of tapered light guides.

12. The device of claim 1, further comprising:
    a housing having at least one opening, the light source mounted in the housing and disposed to emit light substantially in the direction of the opening, and the light distribution element mounted in the housing and disposed between the light source and the opening for distributing the light towards the opening.

13. The device of claim 2, further comprising:
    a second light distribution element mounted in the housing between the opening and the light distribution element.

14. The device of claim 7, wherein the second light distribution element is mounted as to cover the opening of the housing.

15. The device of claim 12, wherein the light distribution element comprises a light diverging screen.

16. The device of claim 15, wherein the light diverging screen comprises a plurality of tapered light guides.

17. A lighting device comprising:
    a light source comprising at least:
        a first feedback layer adapted to receive and reflect light;
        a first electrode formed on the first feedback layer;
        one or more semiconducting layers formed over the first electrode, at least one of the one or more semi-conducting layers comprising luminescent material;

a second electrode disposed over the one or more semiconducting layers; and a second feedback layer adapted to receive and reflect light disposed over the second electrode; and;

a light distribution element disposed adjacent to one or both of the first feedback layer and the second feedback layer and adapted to distribute light emitted therefrom, wherein the first feedback layer or the second feedback layer or both the first feedback layer and the second feedback layer comprise at least a layer of holographic recording material.

18. The device of claim 17, wherein the light distribution element is integral with the light source.

19. The device of claim 17, wherein the light source further comprises a hole injection layer disposed between the first feedback layer and the one or more semiconducting layers.

20. The device of claim 17, wherein the light source further comprises an electron injection layer disposed between the second feedback layer and the one or more semiconducting layers.

21. The device of claim 17, wherein the light source further comprises a hole transport layer disposed between the hole injection layer and the one or more semiconducting layers.

22. The device of claim 17, wherein the light source further comprises an electron transport layer disposed between the electron injection layer and the one or more semiconducting layers.

23. The device of claim 17, wherein the luminescent material comprises pure material, a solid solution, an alloy, or inhomogeneous mixture, or combination thereof.

24. The device of claim 17, wherein the luminescent material comprises a polymer luminescent material.

25. The device of claim 17, wherein the luminescent material comprises a cross-linked organic luminescent material.

26. The device of claim 17, wherein the luminescent material comprises a luminescent material comprising molecules having molecular weight range between that of a small molecule to a polymer.

27. The device of claim 17, wherein the luminescent material comprises a small molecule luminescent material dissolved in a polymer host.

28. The device of claim 17, wherein the luminescent material comprises a fluorescent material.

29. The device of claim 17, wherein the luminescent material comprises a phosphorescent material.

30. The device of claim 17, wherein the luminescent material comprises an organic and inorganic composite luminescent material.

31. The device of claim 17, wherein the luminescent material comprises an inorganic luminescent material.

32. The device of claim 17, wherein the luminescent material comprises a liquid crystalline material.

33. The device of claim 17, further comprising a substrate over which the first feedback layer is disposed.

34. The device of claim 33, wherein the substrate comprises a glass substrate.

35. The device of claim 33, wherein the substrate comprises one or more of a flexible plastic substrate, a metal substrate, a semiconductor material.

36. A lighting device comprising:
a light source comprising at least:
a first feedback layer adapted to receive and reflect light;
a first electrode formed on the first feedback layer;
one or more semiconducting layers formed over the first electrode, at least one of the one or more semi-conducting layers comprising luminescent material;
a second eledctrode disposed over the one or more semiconducting layers; and
a second feedback layer adapted to receive and reflect light disposed over the second electrode; and;
a light distribution element disposed adjacent to one or both of the first feedback layer and the second feedback layer and adapted to distribute light emitted therefrom.
wherein the first feedback layer or the second feedback layer or both the first feedback layer and the second feedback layer comprise at least a layer of material having a plane wave interference pattern.

37. The device of claim 36, wherein one or more of the feedback layers of material comprise at least a layer of holographic recording material.

38. The device of claim 36, wherein one or more of the feedback layers of material comprise at least a layer of photonic crystal material.

39. A light device comprising:
a light source comprising at least:
a first feedback layer adapted to receive and reflect light;
a first electrode formed on the first feedback layer;
one or more semiconducting layers formed over the first electrode, at least one of the one or more semi-conducting layers comprising luminescent material;
a second electrode disposed over the one or more semiconducting layers; and
a second feedback layer adapted to receive and reflect light disposed over the second electrode; and;
a light distribution element disposed adjacent to one or both of the first feedback layer and the second feedback layer and adapted to distribute light emitted therefrom.
wherein the first feedback layer or the second feedback layer or both the first feedback layer and the second feedback layer comprise at least a layer of material having plane wave interference patterns corresponding to different wavelengths of light.

40. The device of claim 39, wherein one or more of the feedback layers of material comprise at least a layer of holographic recording material.

41. The device of claim 39, wherein one or more of the feedback layers of material comprise at least a layer of photonic crystal material.

42. The device of claim 39, wherein the plane wave interference patterns corresponding to each wavelength of light are respectively confined to separate geometrically shaped domains or areas in a plane of the layer of material.

43. The device of claim 42, wherein the geometrically shaped areas comprise parallel stripes.

44. The device of claim 42, wherein the separate geometrically shaped domains or areas in the first feedback layer of material have substantially a same geometrical shape and occupy substantially a same location in a plane of the second feedback layer of material.

45. A lightinh device comprising:
a light source comprising at least;
a first feedback layer adapted to receive and reflect light; a first electrode formed on the first feedback layer;
one or more semiconducting layers formed over the first electrode, at least one of the one or more semi-conducting layers comprising luminescent material;

a second electrode disposed over the one or more semiconducting layers; and a second feedback layer adapted to receive and reflect light disposed over the second electrode; and;

a light distribution element disposed adjacent to one or both of the first feedback layer and the second feedback layer and adapted to distribute light emitted therefrom, wherein the layer of luminescent material comprises two or more luminescent materials each separately patterned into geometrically shaped domains or areas in a plane of the luminescent material.

46. The device of claim 45, wherein the geometrically shaped domains or areas in the plane of the luminescent materials have substantially a same shape and occupy substantially a same location in the plane as the first feedback layer or the second feedback layer or both the first feedback layer and the second feedback layer.

47. The device of claim 46, wherein each of the luminescent materials has a spectral emission band that substantially overlaps a reflection bands of the interference patterns in the corresponding domains or areas in the first feedback layer or the second feedback layer or both the first feedback layer and the second feedback layer.

48. The device of claim 47, wherein one or more of the luminescent materials has a broad spectral band emission that can be used in the domains or areas of the luminescent material located corresponding to domains or areas in the first feedback layer or the second feedback layer or both the first feedback layer and the second feedback layer that have plane wave interference patterns corresponding to different wavelengths of light.

49. A lighting device comprising:
a light source comprising at least:
a first feedback layer adapted to receive and reflect light;
a first electrode formed on the first feedback layer;
one or more semiconducting layers formed over the first electrode, at least one of the one or more semi-conducting layers comprising luminescent material;
a second electrode disposed over the one or more semiconducting layers; and
a second feedback layer adapted to receive and reflect light disposed over the second electrode; and;
a light distributing element disposed adjacent to one or both of the first feedback layer and the second feedback layer and adapted to distribute light emitted therefrom,
wherein a distance between the first feedback layer and the second feedback layer is in an order of approximately one half-wavelength of emitted light.

50. A lighting device comprising:
a light source comprising at least:
a first feedback layer adapted to receive and reflect light;
one or more semiconducting layers formed over the first electrode, at least one of the one or more semi-conducting layers comprising luminescent material;
a second electrode disposed over the one or more semiconducting layers; and
a second feedback layer adapted to receive and reflect light disposed over the second electrode; and;
a light distribution element disposed adjacent to one or both of the first feedback layer and the second feedback layer and adapted to distribute light emitted therefrom,
wherein a distance between the first feedback layer and the second feedback layer is an order of approximately two or more half-wavelengths of emitted light.

51. A lighting device comprising:
a light source comprising at least:
a first feedback layer adapted to receive and reflect light;
a first electrode formed on the first feedback layer;
one or more semiconducting layers formed over the first electrode, at least one of the one or more semi-conducting layers comprising luminescent material;
a second electrode disposed over the one or more semiconducting layers; and
a second electrode feedback layer adapted to receive and reflect light disposed over the second electrode; and;
a light distribution element disposed adjacent to one or both of the first feedback layer and the second feedback layer and adapted to distribute light emitted therefrom,
wherein the luminescent material comprises an electroluminescent material whose spectral emission band overlaps reflection bands of the first feedback layer and the second feedback layer.

52. A lighting device comprising:
a light source comprising at least:
a first feedback layer adapted to receive and reflect light;
a first electrode formed on the first feedback layer;
one or more semiconducting layers formed over the first electrode, at least one of the one or more semi-conducting layers comprising luminescent material;
a second electrode disposed over the one or more semiconducting layers; and
a second electrode feedback layer adapted to receive and reflect light disposed over the second electrode; and;
a light distribution element dispoed adjacent to one or both of the first feedback layer and the second feedback layer and adapted to distribute light emitted therefrom,
wherein the first and the second electrodes, and the one or more semiconducting layers are formed in a defect in a continuous photonic crystal formed by the first feedback layer and the second feedback layer.

53. The device of claim 52, wherein the defect comprises a phase-slip in a spatial phase of the photonic crystal of less than one wavelength of emitted light.

54. The device of claim 52, wherein the light emitted from the layer of luminescent material emanates into a defect mode.

55. The device of claim 52, wherein the photonic crystal structure includes one-dimensional, two-dimensional, or three-dimensional photonic crystal structures or combinations thereof.

56. A lighting device comprising:
a light source comprising at least:
a first feedback layer adapted to receive and reflect light;
a first electrode formed on the first feedback layer;
one or more semiconducting layers formed over the first electrode, at least one of the one or more semi-conducting layers comprising luminescent material;
a second electrode disposed over the one or more semiconducting layers; and
a second feedback layer adapted to receive and reflect light disposed over the second electrode; and;
a light distribution element disposed adjacent to one or both of the first feedback layer and the second feedback layer and adapted to distribute light emitted therefrom, wherein both the first feedback layer and the second feedback layer transmit no light at a peak wavelength of their spectral reflection bands and the luminescent material radiates light into band-edge laser modes.

57. A lighting device comprising:
a light source comprising at least:
a first feedback layer adapted to receive and reflect light;
a first electrode formed on the first feedback layer;
one or more semiconducting layers formed over the first electrode, at least one of the one or more semi-conducting layers comprising luminescent material;
a second electrode disposed over the one or more semiconducting layers; and
a second feedback layer adapted to receive and reflect light disposed over the second electrode; and;
a light distribution element disposed adjacent to one or both of the first feedback layer and the second feedback layer and adapted to distribute light emitted therefrom,
wherein one or both of the first feedback layer and the second feedback layer has a refractive index profile that at least in part varies periodically along an axis normal or substantially normal to a plane of a respective feedback layer.

58. The device of claim 57, wherein one or both of the first feedback layer and the second feedback layer that have periodically varying refractive index profiles have at least in part continuously varying refractive index profiles.

59. A lighting device comprising:
a light source comprising at least:
a first feedback layer adapted to receive and reflect light;
a first electrode formed on the first feedback layer;
one or more semiconducting layers formed over the first electrode, at least one of the one or more semi-conducting layers comprising luminescent material;
a second electrode disposed over the one or more semiconducting layers; and
a second feedback layer adaped to receive and reflect light disposed over the second electrode; and;
a light distribution element disposed adjacent to one or both of the first feedback layer and the second feedback layer and adapted to distribute light emitted therefrom,
wherein a distance between the first feedback layer and the second feedback layer is such that the space between the feedback layers constitutes a cavity in which light of one or more desired wavelengths constructively interfere.

60. A lighting device comprising:
a light source comprising at least:
a first feedback layer adapted to receive and reflect light;
a first electrode formed on the first feedback layer;
one or more semiconducting layers formed over the first electrode, at least one of the one or more semiconducting layers comprising luminescent material;
a second electrode disposed over the one or more semiconducting layers; and
a second feedback layer adapted to receive and reflect light disposed over the second electrode; and;
a light distribution element disposed adjacent to one or both of the first feedback layer and the second feedback layer and adapted to distribute light emitted therefrom,
wherein light reflected by one or both of the first feedback layer and the second feedback layer stimulates emission of light from the one or more layers of luminescent material.

61. The device of claim 60, wherein the stimulated emission of light results in substantial collimation of light emitted by the device.

62. The device of claim 60, wherein the stimulated emission of light results in laser action.

63. A lighting device comprising:
a light source comprising at least:
a first feedback layer adapted to receive and reflect light;
a first electrode formed on the first feedback layer;
one or more semiconducting layers formed over the first electrode, at least one of the one or more semi-conducting layers comprising luminescent material;
a second electrode disposed over the one or more semiconducting layers; and
a second feedback layer adapted to receive and reflect light disposed over the second electrode; and;
a light distribution element disposed adjacent to one or both of the first feedback layer and the second feedback layer and adapted to distribute light emitted therefrom,
wherein all light emitted by the device occupies a single light propagation mode.

64. The device of claim 63, wherein spacing between the first feedback layer and the second feedback layer is equivalent to $\lambda/2$ excluding phase shifts due to reflection, $\lambda$ being a wavelength of the light in the single light propagation mode.

65. A light device comprising;
a light source comprising at least:
a first feedback layer adapted to receive and reflect light;
a first electrode formed on the first feedback layer;
one or more semiconducting layers formed over the first electrode, at least one of the one or more semi-conducting layers comprising luminescent material;
a second electrode disposed over the one or more semiconducting layers; and
a second feedback layer adapted to receive and reflect light disposed over the second electrode;
a light distribution element disposed adjacent to one or both of the first feedback layer and the second feedback layer and adapted to distribute light emitted therefrom,
wherein light emitted by the device occupies two or more light propagation modes.

66. A lighting device comprising:
a light source comprising at least;
a first feedback layer adapted to receive and reflect light;
a first electrode formed on the first feedback layer;
one or more semiconducting layers formed over the first electrode, at least one of the one or more semi-conducting layers comprising luminescent material;
a second electrode disposed over the one or more semiconducting layers; and
a second feedback layer adapted to receive and reflect light disposed over the second electrode; and;
a light distribution element disposed adjacent to one or both of the first feedback layer and the second feedback layer and adapted to distribute light emitted therefrom,
wherein one or both of the first feedback layer and the second feedback layer comprises refractive index profiles that have superimposed multiple periodic spatial frequencies of variation.

* * * * *